US007620862B1

(12) United States Patent
Lai

(10) Patent No.: US 7,620,862 B1
(45) Date of Patent: Nov. 17, 2009

(54) METHOD OF AND SYSTEM FOR TESTING AN INTEGRATED CIRCUIT

(75) Inventor: Andrew Wing-Leung Lai, Fremont, CA (US)

(73) Assignee: XILINX, Inc., San Jose, CA (US)

( * ) Notice: Subject to any disclaimer, the term of this patent is extended or adjusted under 35 U.S.C. 154(b) by 504 days.

(21) Appl. No.: 11/221,438

(22) Filed: Sep. 8, 2005

(51) Int. Cl.
G01R 31/28 (2006.01)
G06F 11/00 (2006.01)
G06F 1/00 (2006.01)

(52) U.S. Cl. .................. 714/725; 714/25; 714/47; 714/48; 714/55; 713/500

(58) Field of Classification Search .................. None
See application file for complete search history.

(56) References Cited

U.S. PATENT DOCUMENTS

| | | | | |
|---|---|---|---|---|
| 4,791,356 A | * | 12/1988 | Warren et al. | 324/73.1 |
| 5,177,440 A | * | 1/1993 | Walker et al. | 714/736 |
| 5,381,087 A | * | 1/1995 | Hirano | 324/158.1 |
| 5,948,105 A | * | 9/1999 | Skurnik et al. | 713/323 |
| 6,047,344 A | * | 4/2000 | Kawasumi et al. | 710/107 |
| 6,145,087 A | * | 11/2000 | Ishihara | 713/500 |
| 6,249,893 B1 | * | 6/2001 | Rajsuman et al. | 714/741 |
| 6,430,720 B1 | * | 8/2002 | Frey et al. | 714/744 |
| 6,756,827 B2 | * | 6/2004 | Konuk et al. | 327/116 |
| 6,918,074 B2 | * | 7/2005 | Kim et al. | 714/733 |
| 7,103,815 B2 | * | 9/2006 | Ong et al. | 714/736 |
| 7,197,725 B2 | * | 3/2007 | Takeoka et al. | 716/4 |
| 7,403,058 B2 | * | 7/2008 | Yeh et al. | 327/291 |
| 2004/0215442 A1 | * | 10/2004 | Musselman | 703/24 |
| 2005/0060621 A1 | * | 3/2005 | Lee et al. | 714/718 |
| 2005/0218957 A1 | * | 10/2005 | Konuk et al. | 327/316 |
| 2006/0080585 A1 | * | 4/2006 | Kiryu | 714/733 |

* cited by examiner

Primary Examiner—Kevin L Ellis
Assistant Examiner—Guerrier Merant
(74) Attorney, Agent, or Firm—John J. King; Robert M. Brush

(57) ABSTRACT

The methods and circuits of the present invention relate to testing integrated circuits. According to one aspect of the invention, a method of testing an integrated circuit is disclosed. The method comprises the steps of coupling test equipment to the integrated circuit; coupling a test equipment clock signal from the test equipment to the integrated circuit, wherein the test equipment clock signal has a first frequency; generating an internal burst clock signal within the integrated circuit based upon the test equipment clock signal, wherein the internal test clock signal has a burst frequency; and testing the integrated circuit using the internal burst clock signal. Other methods and circuits for testing programmable logic devices are also described.

19 Claims, 5 Drawing Sheets

Burst Frequency (MHZ) and Slack time (nS) for M/D Ratios

| M/D | 6/1 | 7/1 | 8/1 | 9/1 | 10/1 | 11/1 | 12/1 | 13/1 | 14/1 | 15/1 | 16/1 |
|---|---|---|---|---|---|---|---|---|---|---|---|
| 10.0 | 60 / 33.3 | 70 / 42.9 | 80 / 50.0 | 90 / 55.6 | 100 / 60.0 | 110 / 63.6 | 120 / 66.7 | 130 / 69.2 | 140 / 71.4 | 150 / 73.3 | 160 / 75.0 |
| 12.5 | 75 / 26.7 | 87.5 / 34.3 | 100 / 40.0 | 113 / 44.4 | 125 / 48.0 | 138 / 50.9 | 150 / 53.3 | 163 / 55.4 | 175 / 57.1 | 188 / 58.7 | 200 / 60.0 |
| 15.0 | 90 / 22.2 | 105 / 28.6 | 120 / 33.3 | 135 / 37.0 | 150 / 40.0 | 165 / 42.4 | 180 / 44.4 | 195 / 46.2 | 210 / 47.6 | 225 / 48.9 | 240 / 50.0 |
| 16.7 | 100 / 20.0 | 117 / 25.7 | 133 / 30.0 | 150 / 33.3 | 167 / 36.0 | 183 / 38.2 | 200 / 40.0 | 217 / 41.5 | 233 / 42.9 | 250 / 44.0 | 267 / 45.0 |
| 20.0 | 120 / 16.7 | 140 / 21.4 | 160 / 25.0 | 180 / 27.8 | 200 / 30.0 | 220 / 31.8 | 240 / 33.3 | 260 / 34.6 | 280 / 35.7 | 300 / 36.7 | 320 / 37.5 |
| 25.0 | 150 / 13.3 | 175 / 17.1 | 200 / 20.0 | 225 / 22.2 | 250 / 24.0 | 275 / 25.5 | 300 / 26.7 | 325 / 27.7 | 350 / 28.6 | 375 / 29.3 | 400 / 30.0 |
| 30.0 | 180 / 11.1 | 210 / 14.3 | 240 / 16.7 | 270 / 18.5 | 300 / 20.0 | 330 / 21.2 | 360 / 22.2 | 390 / 23.1 | 420 / 23.8 | 450 / 24.4 | 480 / 25.0 |
| 35.0 | 210 / 9.5 | 245 / 12.2 | 280 / 14.3 | 315 / 15.9 | 350 / 17.1 | 385 / 18.2 | 420 / 19.0 | 455 / 19.8 | 490 / 20.4 | 525 / 21.0 | 560 / 21.4 |
| 40.0 | 240 / 8.3 | 280 / 10.7 | 320 / 12.5 | 360 / 13.9 | 400 / 15.0 | 440 / 15.9 | 480 / 16.7 | 520 / 17.3 | 560 / 17.9 | 600 / 18.3 | 640 / 18.8 |
| 45.0 | 270 / 7.4 | 315 / 9.5 | 360 / 11.1 | 405 / 12.3 | 450 / 13.3 | 495 / 14.1 | 540 / 14.8 | 585 / 15.4 | 630 / 15.9 | 675 / 16.3 | 720 / 16.7 |
| 50.0 | 300 / 6.7 | 350 / 8.6 | 400 / 10.0 | 450 / 11.1 | 500 / 12.0 | 550 / 12.7 | 600 / 13.3 | 650 / 13.8 | 700 / 14.3 | 750 / 14.7 | 800 / 15.0 |

Test Equipment Frequency

FIG. 7

| Test Equipment Freq. (MHz) | M/D | Burst Clock Freq. (MHz) | Slack (nS) | Lock Time (based on 10 MHz) | Effective Test Freq. (MHz) |
|---|---|---|---|---|---|
| 10.00 | 15/1 | 150 | 73.33 | 1.00 | 50.00 |
| 12.50 | 12/1 | 150 | 53.33 | 0.80 | 62.50 |
| 15.00 | 10/1 | 150 | 40.00 | 0.67 | 75.00 |
| 16.67 | 9/1 | 150 | 33.33 | 0.60 | 83.33 |
| 25.00 | 6/1 | 150 | 13.33 | 0.40 | 125.00 |

FIG. 8

METHOD OF AND SYSTEM FOR TESTING AN INTEGRATED CIRCUIT

FIELD OF THE INVENTION

The present application is related to integrated circuits, and in particular, to a method of and system for testing an integrated circuit.

BACKGROUND OF THE INVENTION

In manufacturing and employing semiconductor devices, it is important that the devices operate properly. When a completed semiconductor device malfunctions after it has been installed in a finished product, such as a consumer electronics product, the malfunction of the semiconductor device may cause the entire product to fail. That is, the malfunction of a single semiconductor device may cause an entire consumer electronics device to function improperly. Most semiconductor devices are formed using a number of material layers. Each layer is patterned to add or remove selected portions to form circuit features that will eventually make up a complete integrated circuit. Because problems encountered in the formation of any one layer may render an entire device unusable, defective devices are therefore tested to physically locate defects. One goal of testing devices it to identify individual devices which may have a defect, while a secondary goal is to help to troubleshoot device processes.

One type of semiconductor device is a programmable logic device, such as a complex programmable logic device (CPLD) or a field programmable gate array (FPGA), which is designed to be user-programmable so that users may implement logic designs of their choices. In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream into configuration memory cells of the FPGA. As circuit designs implemented in an FPGA have become more complex, the number of CLBs, IOBs, and/or other resources (such as multiplexers and block RAMs) has increased, as well as the routing resources to make the connections between the various blocks. Accordingly, programmable logic devices are one group of integrated circuits which particularly benefit from testing. Test programs for FPGAs typically consist of many paired test patterns including one to configure the FPGA, and another to test the functionality of the FPGA after configuration. Because the circuits implemented by different customers using programmable logic devices are generally unique, a test may be specific to the elements used by the implemented circuit. In some cases, a circuit design may undergo modifications during a product development phase. Thus, multiple versions of a circuit may be implemented on an FPGA, requiring multiple tests of the circuit.

Test equipment typically has limitations in testing a device under test (DUT), such as an FPGA. The maximum number of test patterns which will fit into a scan memory is loaded at the beginning of a test operation, and then the test equipment applies the test patterns to one or more devices mounted on the test equipment. While device test coverage is increased with the application of more test patterns, test equipment is also limited by its operating frequency. As more test patterns are required to adequately test the increasingly complex designs, the time required to test the designs has significantly increased. Although it is possible to use test equipment which runs at a higher operating frequency, it is often prohibitively costly to upgrade existing test equipment to operate at a higher frequency or replace test equipment with faster test equipment.

Accordingly, there is a need for a method of and circuit for decreasing the time required to test an integrated circuit.

SUMMARY OF THE INVENTION

The methods and circuits of the present application relate to testing integrated circuits. According to one embodiment of the invention, a method of testing an integrated circuit is disclosed. The method comprises steps of coupling test equipment to the integrated circuit; coupling a test equipment clock signal from the test equipment to the integrated circuit, wherein the test equipment clock signal has a first frequency; generating an internal burst clock signal within the integrated circuit based upon the test equipment clock signal, wherein the internal burst clock signal has a burst frequency; and testing the integrated circuit using the internal burst clock signal.

According to an alternate embodiment, a method of testing a programmable logic device comprises steps of configuring the programmable logic device; applying a clock synthesis value to the programmable logic device; generating an internal burst clock signal based upon the clock synthesis value and an external test clock signal from the test equipment; and generating test data using the internal burst clock signal.

Finally, a system for testing the operation of a circuit is described. The system comprises an integrated circuit implementing the circuit to be tested; test equipment coupled to the integrated circuit, the test equipment operating at a first frequency and programming the integrated circuit to operate at a second frequency; a control circuit generating an internal clock signal switching between a first clock signal having said first frequency and a second clock signal having said second frequency; and test data output by the integrated circuit to the test equipment, the test data verifying the operation of the circuit. Specific examples of integrated circuits comprising a frequency synthesizer, and in particular, a frequency synthesizer implemented in a programmable logic device, are described.

BRIEF DESCRIPTION OF THE DRAWINGS

FIG. 7 is a table showing burst frequencies and slack times for various test equipment frequencies and M/D ratios according to an embodiment of the present invention;

FIG. 8 is a table showing lock times and effective test frequencies for a given burst clock frequency according to an embodiment of the present invention;

DETAILED DESCRIPTION OF THE DRAWINGS

Figure 1:
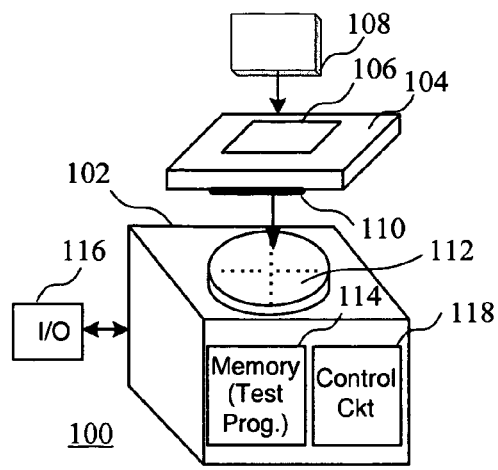
FIG. 1 is a perspective view of a test equipment arrangement for testing an integrated circuit according to an embodiment the present invention.

Turning first to FIG. 1, a perspective view of a test equipment arrangement for testing an integrated circuit according to an embodiment the present invention is shown. Test equipment 102 is coupled to receive an adapter 104 having a first connector 106 adapted to receive a device under test 108, and a second connector 110 to couple the adapter to a corresponding connector 112 of the test equipment. The device under test 108 may be any type of integrated circuit, such as a programmable logic device. The test equipment 102, also commonly called automatic test equipment (ATE), comprises a memory 114 which stores test programs to be applied to the device under test. The test equipment is adapted to receive one or more test programs by way of a test data generator. The test data generator may be a computer separate from the test equipment and may be coupled to the test equipment by way of an input/output port 116. Alternatively, the test equipment 102 may comprise circuits and software associated with a test generator. The test equipment 102 also preferably comprises a control circuit 118 for controlling the operation of the test equipment. An example of test equipment which may be used in an embodiment of the present invention is the J750 Tester available from Teradyne, Inc. of Boston, Mass., although other suitable test equipment may be used.

Figure 2:
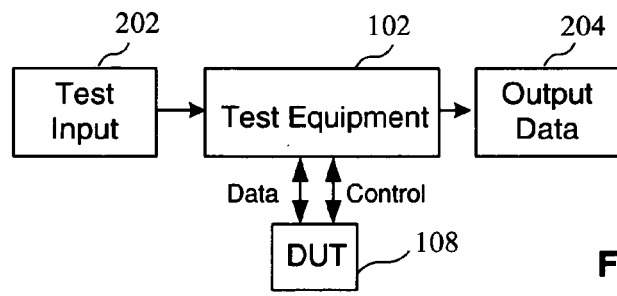
FIG. 2 is a block diagram of a circuit for testing an integrated circuit according to an embodiment of the present invention.

Turning now to FIG. 2, a block diagram of a circuit for testing an integrated circuit according to an embodiment of the present invention is shown. A test input 202 comprising test data and/or configuration data is coupled to the test equipment 102, which generates output data 204. The test equipment 102 couples data and control signal to and receives return data and control signals from the device under test 108. The data is written to or read from the device under test at a first frequency. The device under test internally generates an internal test clock signal having a second frequency, called a burst frequency, and comprising a predetermined number of pulses during a clock period of the test equipment clock signal. The internal test clock signal is used to implement an internal test of the integrated circuit. A test output from the device under test will then be provided to the test equipment using the test equipment clock having the first frequency. The test output will generally provide information verifying circuit elements in the device under test. As will be described in more detail below, the embodiments of the present invention improve testing of a device under test by enabling faster testing of an integrated circuit, such as a programmable logic device, using test equipment having a limited operating frequency that may be less than a desired test frequency for the integrated circuit.

Figure 3:
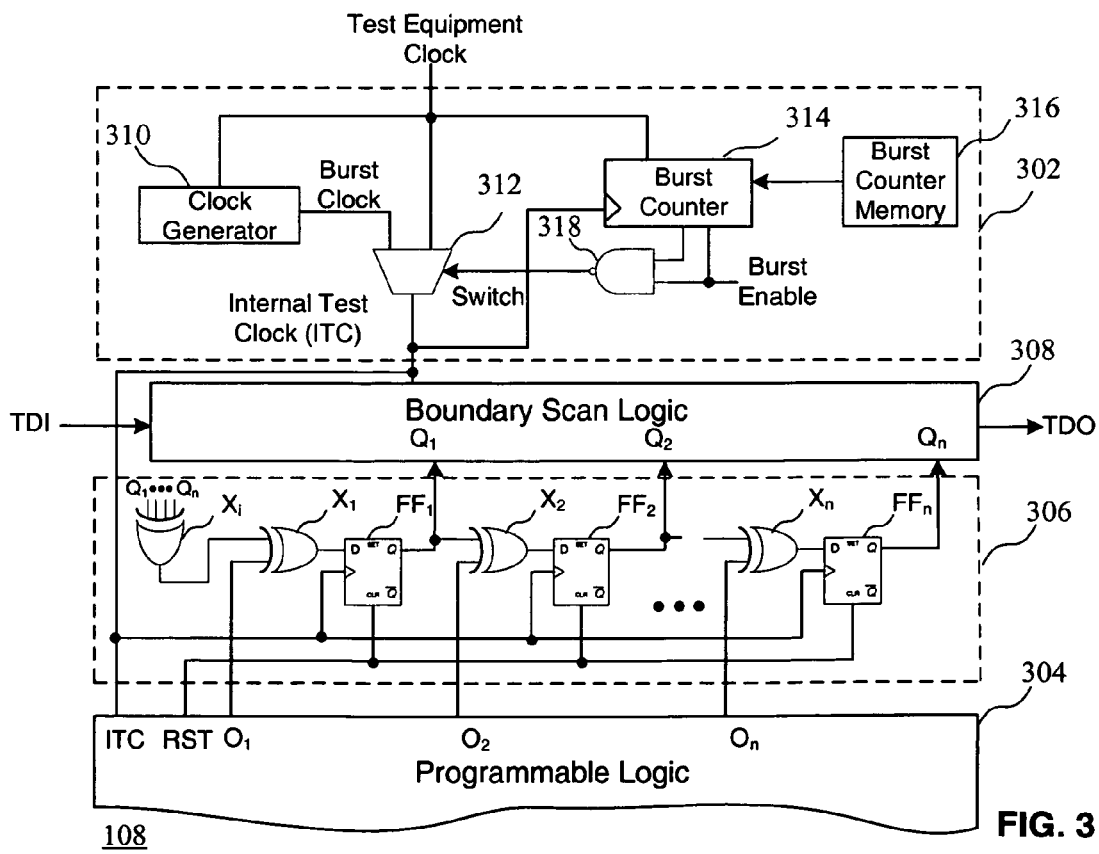
FIG. 3 is a block diagram of a circuit for increasing the effective test frequency of a device under test according to an embodiment of the present invention.

Turning now to FIG. 3, a block diagram of a circuit for increasing the effective test frequency of a device under test according to an embodiment of the present invention is shown. According to the embodiment of FIG. 3, a device under test 108 comprises a control circuit 302, a programmable logic portion 304, a multiple input signature register (MISR) circuit 306, and a boundary scan chain 308. The programmable logic portion 304 preferably implements the circuit to be tested according to the embodiment of FIG. 3. As will be described in more detail below, the control circuit 302 is used to generate the appropriate internal test clock (ITC) signal for enabling the device under test to internally generate test data based upon a clock signal which is at a higher frequency than the test equipment clock. In particular, a clock generator 310 generates a burst clock which is coupled to a multiplexer 312. The clock generator may be any circuit for generating a clock signal based upon a reference clock signal, such as the test equipment clock signal in this case. For example, the circuit may comprise a phase locked loop circuit or a delay locked loop circuit. The control circuit 302 may generate an internal test clock having a frequency which is an integral multiple of the reference clock, or may be a synthesized value which is a multiple of M/D of the reference clock, where M and D values are clock synthesizer values, and M is a multiplier factor and D is a divider factor, as is well known in the art.

In addition to receiving the burst clock, the multiplexer 312 is also coupled to receive the test equipment clock signal generated by the test equipment. The output of the multiplexer 312, which represents the internal test clock signal, is either based upon the burst clock generated by the clock generator, or the test equipment clock. The selection of the output of the multiplexer 312 may be determined by a value generated by a burst counter 314. That is, the output of the burst counter coupled to a NAND gate 318 is based upon a comparison of the count of the output of the multiplexer 312 (i.e., a count of the burst pulse generated by the clock generator 310) and a value stored in a burst counter memory 316. A burst enable signal, which is coupled to both the burst counter and the NAND gate 318, enables a switch signal generated in response to an output of the burst counter to correctly select the output of the buffer 312 as the burst clock or the test equipment clock (as will be described in more detail in reference to FIG. 5 below). As will be described in reference to FIG. 6, the burst enable signal may be used to introduce test equipment pulses at the beginning of the test cycle in order to shift burst pulses for analysis and diagnosis.

The internal test clock, which is output by the multiplexer 312, is coupled to MISR circuit 306. The MISR circuit monitors output signals $O_1$-$O_n$ from programmable logic portion 304 and provides the resulting signature data to boundary scan chain 308 via signal lines $Q_1$-$Q_n$. According to one aspect of the embodiment of FIG. 3, the frequency of the burst clock is selected so that the MISR may capture output responses at the frequency of the burst clock. Boundary scan chain 308 accepts an input signal on the Test Data In (TDI) terminal, incorporates the data provided by MISR circuit 306 on signal lines $Q_1$-$Q_n$, and provides an output signal Test Data Out (TDO), as is well known in the art. This output signal may be monitored, for example, by the test equipment and compared to expected signature data for programmable logic portion 304. The expected signature data may be determined, for example, by advance simulation of the MISR circuit and the test circuit implemented in the programmable logic portion of the PLD.

Although FIG. 3 shows one possible implementation for MISR circuit 306, MISR circuits are well-known in the relevant art, and any MISR implementation may be used. The illustrated MISR circuit 306 includes a series of memory elements, shown in this embodiment as flip-flops, $FF_1$-$FF_n$ alternating with exclusive OR (XOR) elements $X_1$-$X_n$. Each flip-flop $FF_1$-$FF_n$ is reset by a reset signal RST from the re-programmable logic portion 304, such as by a global set/reset signal GSR. Each flip-flop $FF_1$-$FF_n$ is clocked by the internal test clock signal. Thus, the timing of the MISR circuit 306 is the same as the timing of the programmable logic portion 304 of the PLD.

Each XOR element $X_1$-$X_n$ is driven by an associated output terminal $O_1$-$O_n$ of programmable logic portion 304 and by the registered output signal Q from a preceding memory element. Each XOR element $X_1$-$X_n$ drives the data input terminal D of a subsequent memory element $FF_1$-$FF_n$ in the series. An initial XOR element X drives the first XOR element $X_1$ in the series. XOR element $X_i$ is driven by output terminals of selected ones of the memory elements. The selection of MISR taps (i.e., which memory element outputs are fed back to initial XOR element $X_i$) may be made, for example, to maximize sensitivity to output errors and to minimize aliasing. The number of memory elements in MISR circuit 306 may be, for example, based on the number of output signals available from the programmable logic portion 304 of the PLD. Finally, boundary scan logic 308 may conform to any desired boundary scan protocol. For example, boundary scan logic 308 may conform to the LSSD protocol or the IEEE 1149 JTAG protocol. Alternatively, the boundary scan logic 308 may be omitted, and the signature data from MISR circuit 306 may be provided to the test equipment or observer using other circuits or methods.

The circuit of FIG. 3 is preferably implemented on the device under test. Alternatively, portions of the circuit may be implemented on the device under test and the remaining portions may be implemented on a separate component or device coupled between test equipment and the device under test. For example, the portions of the circuits required to test the circuit may be implemented on the device under test, while portions of the circuit for generating an internal test clock may be implemented on a component, such as adapter 104 of FIG. 1, coupled between the test equipment and the device under test. Alternatively, portions of the circuit may be implemented on the test equipment, where the modification to the test equipment would not require the costly upgrade of the processor of the test equipment. While the circuit may be implemented on any integrated circuit, the circuit of FIG. 3 is particularly well suited for a programmable logic device where the various circuits of FIG. 3 may be easily implemented in programmable and/or fixed logic.

Figure 4:
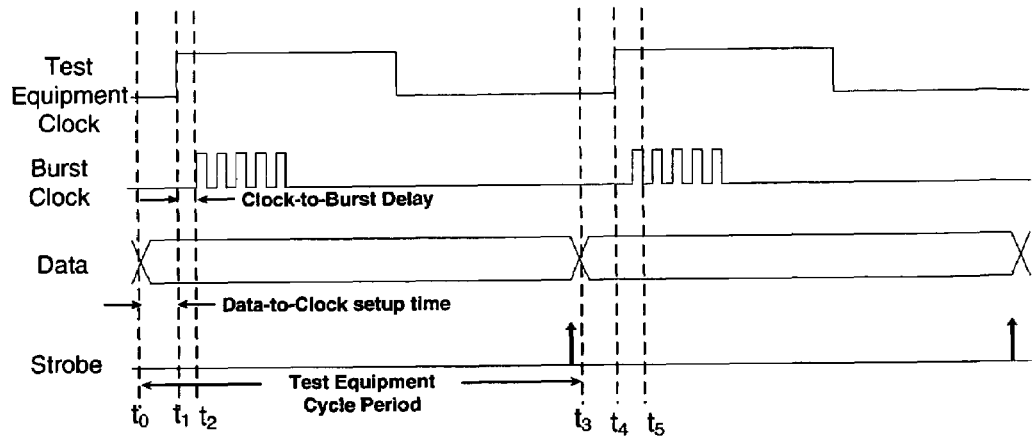
FIG. 4 is a timing diagram showing the detection of data according to an embodiment of the present invention.

Turning now to FIG. 4, a timing diagram shows the detection of data according to an embodiment of the present invention. As shown in FIG. 4, a rising edge of the test equipment clock is received by the device under test at a time $t_1$. After a Clock-to-Burst delay period associated with generating a burst clock, the first pulse of the burst clock is generated by the device under test at a time $t_2$. Data is received after a Data-to-Clock set up time between times $t_0$ and $t_1$. Data is then strobed after a test equipment cycle period at a time $t_3$. Finally, a second rising edge of the test equipment clock is received at a time $t_4$, generating another set of clock bursts at a time $t_5$. By way of example, if the tester clock is operating at 10 MHz and the clock burst comprises five pulses in a clock burst period, the internal test circuit provides an effective test speed of 50 MHz. Although five clock burst are shown, the number of clock burst may be programmable and therefore selectable by a user. The frequency of the clock bursts may be limited by the circuit generating the clock bursts. In implementing a circuit employing the clock bursts, the clock burst frequency is preferably selected to not exceed a maximum frequency of a circuit associated with the device under test to be analyzed.

Figure 5:
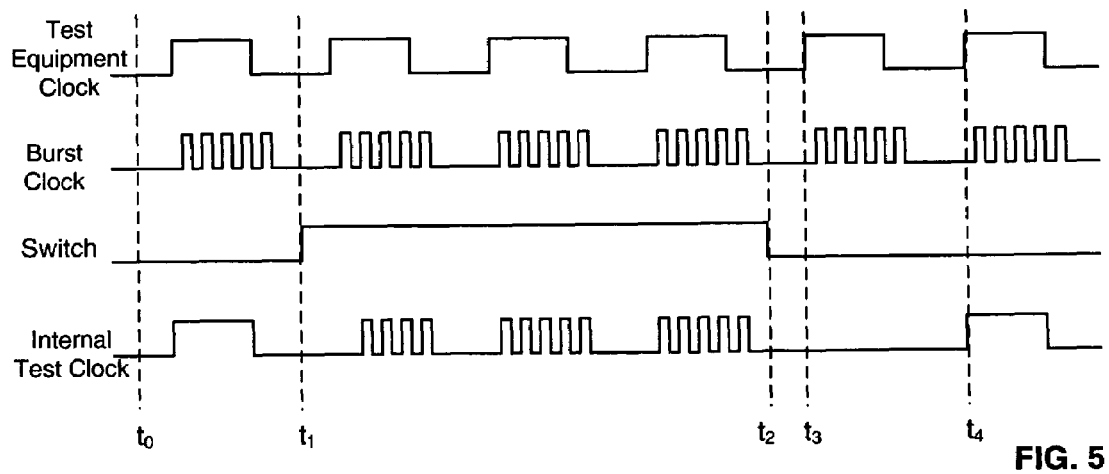
FIG. 5 is a timing diagram showing the generation of an internal test clock signal according to an embodiment of the present invention.

Turning now to FIG. 5, a timing diagram shows the generation of an internal test clock signal according to an embodiment of the present invention. As can be seen, the test equipment clock and the burst clock are generated, where the burst clock is based upon the test equipment clock. A switch signal is generated to enable the selection of either the test equipment clock or the burst clock to be output as the internal test clock signal. For example, the burst clock may be generated by the clock generator 310 of FIG. 3, while the switch signal may be generated to enable the selection of the test equipment clock or the burst clock using the remaining portions of the control circuit 302. Although one example of a circuit for generating the internal test clock signal is shown, other circuits could be employed by one skilled in the art for generating the internal test clock signal as shown.

As can be seen in the example of FIG. 5, the switch signal goes high at a time $t_1$, resulting in the internal test clock comprising the pulses of the burst clock until the switch goes low at time $t_2$. The internal test clock signal provides a signal which enables both internal testing at the burst pulse frequency and positioning of a specific burst clock pulse at a certain time to enable strobing the outputs at that time for diagnosis and analysis. As can be seen in the waveform of the internal test clock, the first series of burst pulses includes only four pulses, as a result of switching clock domains from the test equipment clock domain to the device under test clock domain. Accordingly, this should be taken into account when generating test data. Similarly, as can be seen after the falling edge of the switch signal at time $t_2$, the test equipment clock signal is not used to generate the internal test clock at a time $t_3$ as would be expected, but is only used to generate the internal test clock after a time $t_4$.

Although the strobing of the data when the test equipment clock output is low after the last burst clock signals provides useful information by capturing data (such as data stored in the MISR circuit), the circuit will only capture data present at the last clock burst. By comparing values of the MISR circuit to known values, it may be possible to determine the time (i.e., the falling edge of a given burst pulse) when an error is detected. While the detection of the point in time when an error is detected provides limited information, additional information may be learned by determining the actual output signals at the clock pulse when an error was detected. As will be described in detail below in reference to FIG. 6, a fixed number of test equipment clock pulses may be added to the internal test clock so that a particular pulse of the burst clock will correspond with the time when data is strobed to capture data at a particular time when an error is detected for diagnosis and analysis.

Figure 6:
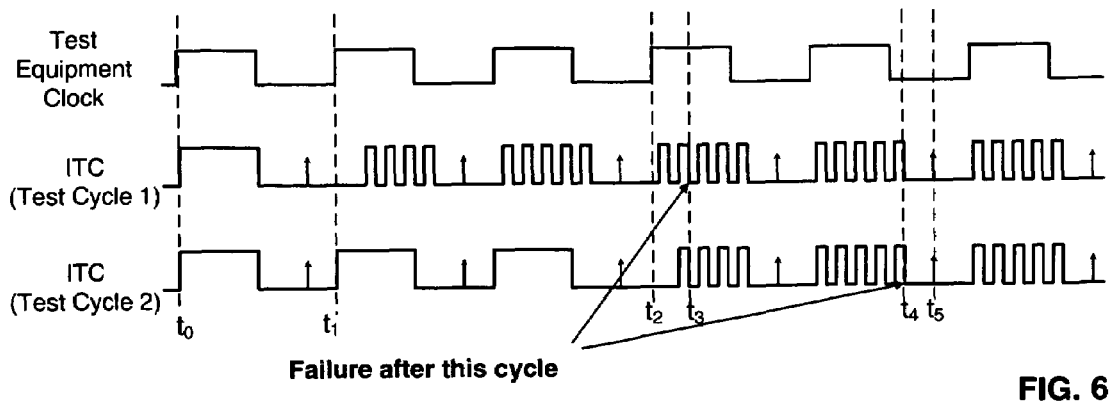
FIG. 6 is a timing diagram showing the shifting of an internal test clock signal according to an embodiment of the present invention.

Turning now to FIG. 6, a timing diagram shows the shifting of an internal test clock signal according to an embodiment of the present invention. As can be seen, an initial test cycle (test cycle 1) of the internal test clock revealed an error after the eleventh clock pulse at a time $t_3$. The error may be detected by comparing the values generated by the MISR circuit with known values. However, the eleventh clock pulse does not occur when the data is strobed to capture the data. That is, the test equipment is not able to analyze and diagnose the error by looking at the output signals at the eleventh pulse. Accordingly, offset pulses comprising a fixed number of test equipment clock pulses are introduced to shift the internal test clock so that the data that is strobed corresponds to the data at the time when an error was detected. As can be seen in the internal test clock of test cycle 2, two additional clock pulses are added between times $t_2$ and $t_3$ so that the eleventh clock pulse occurs at time $t_4$. Accordingly, the data associated with the eleventh clock pulse corresponds to the data strobe signal at time $t_5$.

Turning now to FIG. 7, a table shows burst frequencies and slack times for various combinations of test equipment frequencies and M/D ratios according to an embodiment of the present invention. As can be seen in this example, the various rows correspond to different test equipment frequencies, which range from 10 to 50 MHz, and different M/D ratios, ranging from 6/1 to 16/1. For example, for an M/D ratio of 6/1, the internal test clock will have a frequency of 6 times the test equipment clock. The D value is preferably always 1 to make it easier to determine in which part of the clock cycle the generated pulses will appear. Each entry in the table comprises a burst frequency (in MHz) in the upper left corner and a slack time (in nS) in the lower right corner. The slack time represents burst period subtracted from the test equipment clock period. Sufficient slack time is necessary to provide for set up and hold to capture the detected values. However, depending upon the combination of the test equipment frequency and the M/D ratio, the burst frequency may exceed that maximum frequency for a circuit to detect signals internal to the device under test (as shown in the lightly shaded boxes). For example, the burst frequency may exceed the maximum frequency for a MISR circuit, such as the MISR circuit 306 of FIG. 3. Similarly, if the slack time becomes too short, the circuit will not have sufficient setup and hold time to capture the desired values (as shown in the darker shaded boxes). Accordingly, as can be seen, depending upon available test equipment frequencies, the M/D ratio must be selected to optimize the burst frequency while taking into account the reduced slack time as the test equipment frequency is increased.

Turning now to FIG. 8, a table shows lock times and effective test frequencies for a given clock frequency according to an embodiment of the present invention. For a desired burst frequency of 150 MHz according to the example of FIG. 8, the test equipment frequency and the M/D ratio may be selected to both reduce the lock time and increase the effective test frequency. However, as can also be seen, when the lock time is reduced and the effective test frequency is increased, the slack time decreases.

Figure 9:
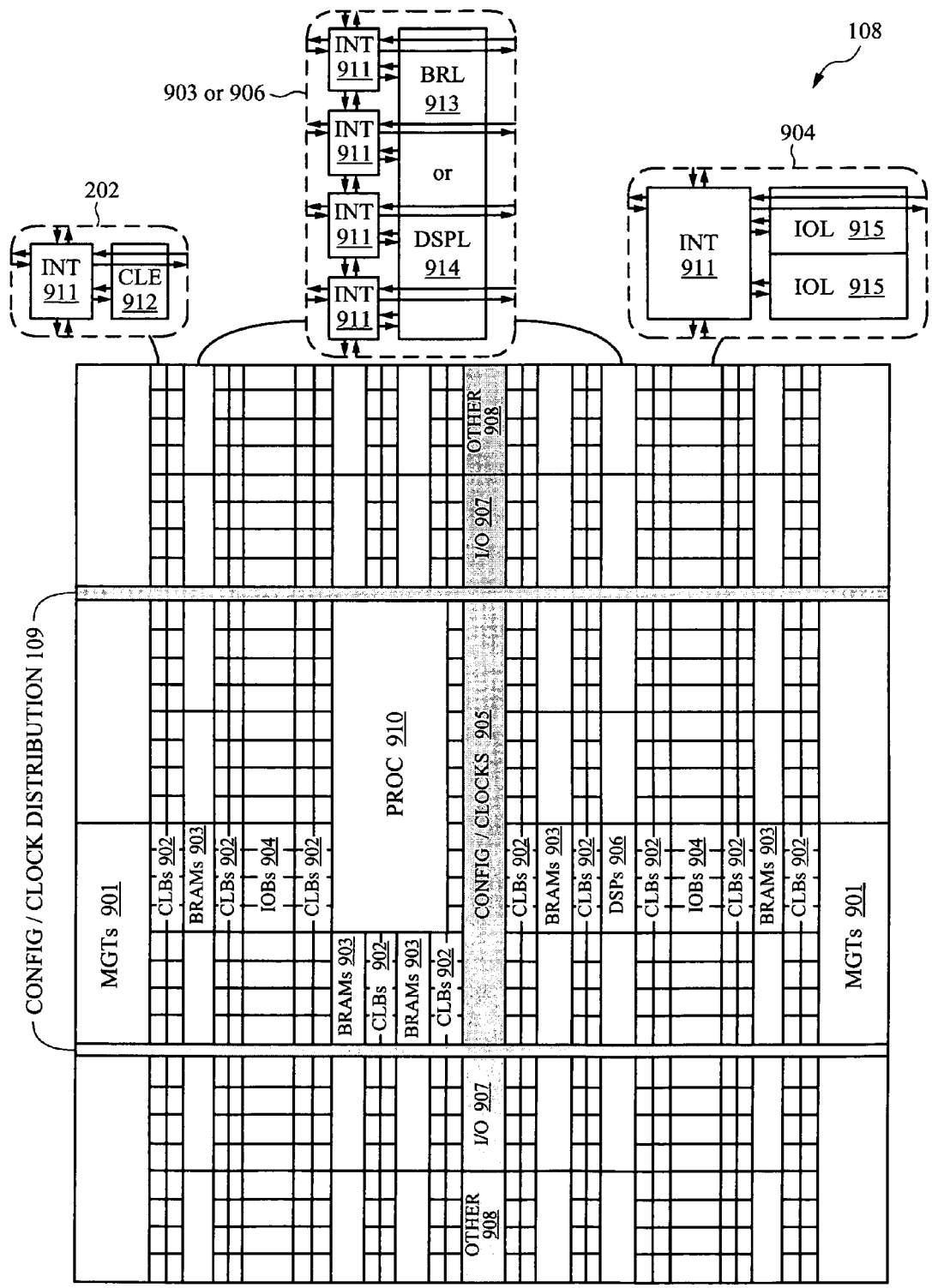
FIG. 9 is a block diagram of a programmable logic device according to an embodiment of the present invention.

Turning now to FIG. 9, a block diagram of a programmable logic device according to an embodiment of the present invention is shown. The circuit of FIG. 9 may be the device under test of FIG. 2, and may implement all or a portion of the circuit of FIG. 3, for example. In particular, advanced FPGAs may include several different types of programmable logic blocks in the array. For example, FIG. 9 illustrates an FPGA architecture that includes a large number of different programmable tiles including multi-gigabit transceivers (MGTs 901), configurable logic blocks (CLBs 902), random access memory blocks (BRAMs 903), input/output blocks (IOBs 904), configuration and clocking logic (CONFIG/CLOCKS 905), digital signal processing blocks (DSPs 906), specialized input/output blocks (I/O 907) (e.g., configuration ports and clock ports), and other programmable logic 908 such as digital clock managers, analog-to-digital converters, system monitoring logic, and so forth. Some FPGAs also include one or more dedicated processor blocks (PROC 910).

In some FPGAs, each programmable tile includes a programmable interconnect element (INT 911) having standardized connections to and from a corresponding interconnect element in each adjacent tile. Therefore, the programmable interconnect elements taken together implement the programmable interconnect structure for the illustrated FPGA. The programmable interconnect element (INT 911) also includes the connections to and from the programmable logic element within the same tile, as shown by the examples included at the top of FIG. 9.

For example, a CLB 902 may include a configurable logic element (CLE 912) that may be programmed to implement user logic plus a single programmable interconnect element (INT 911). A BRAM 903 may include a BRAM logic element (BRL 913) in addition to one or more programmable interconnect elements. Typically, the number of interconnect elements included in a tile depends on the height of the tile. In the pictured embodiment, a BRAM tile has the same height as four CLBs, but other numbers (e.g., five) may also be used. A DSP tile 906 may include a DSP logic element (DSPL 914) in addition to an appropriate number of programmable interconnect elements. An IOB 904 may include, for example, two instances of an input/output logic element (IOL 915) in addition to one instance of the programmable interconnect element (INT 911). As will be clear to those of skill in the art, the actual I/O pads connected, for example, to the I/O logic element 915 are manufactured using metal layered above the various illustrated logic blocks, and typically are not confined to the area of the input/output logic element 915.

In the pictured embodiment, a columnar area near the center of the die (shown shaded in FIG. 9) is used for configuration, clock, and other control logic. Horizontal areas 909 extending from this column are used to distribute the clocks and configuration signals across the breadth of the FPGA. Some FPGAs utilizing the architecture illustrated in FIG. 9 include additional logic blocks that disrupt the regular columnar structure making up a large part of the FPGA. The additional logic blocks may be programmable blocks and/or dedicated logic. For example, the processor block PROC 910 shown in FIG. 9 spans several columns of CLBs and BRAMs.

Note that FIG. 9 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 9 are purely exemplary. For example, in an actual FPGA more than one adjacent column of CLBs is typically included wherever the CLBs appear, to facilitate the efficient implementation of user logic. Similarly the circuits and methods of the present invention may be implemented in any device, including any type of programmable logic device, having memory.

Figure 10:
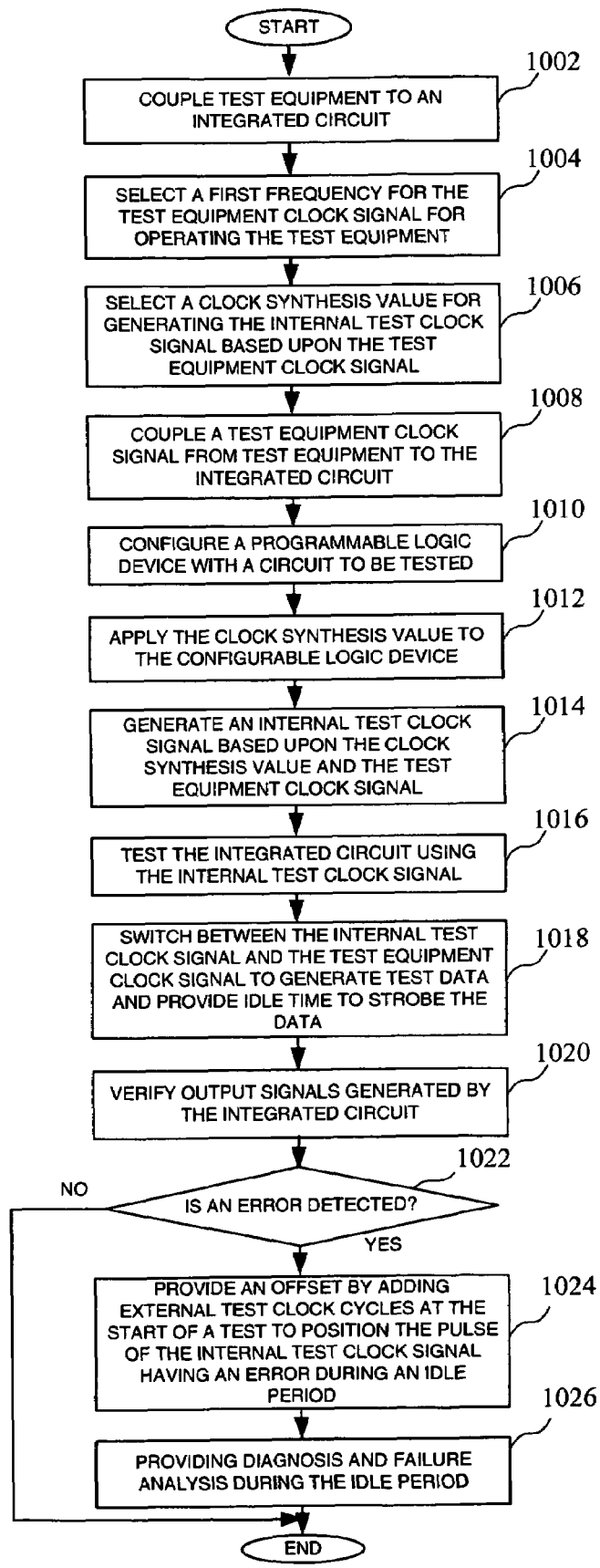
FIG. 10 is a flow chart showing a method of testing an integrated circuit according to an embodiment the present invention.

FIG. 10 is a flow chart showing a method of testing an integrated circuit according to an embodiment the present invention. The method of FIG. 10 may be implemented using the circuits and timing waveforms of FIGS. 1-6, for example, or some other suitable circuits and waveforms. In particular, test equipment is coupled to an integrated circuit at a step 1002. A first frequency for the test equipment clock signal is selected for operating the test equipment at a step 1004. While test equipment will have a fixed maximum frequency, a user may desire to select some other frequency. A clock synthesis value is selected for generating the internal test clock signal based upon the test equipment clock signal at a step 1006. The clock synthesis value may comprise an M or D value as described above. A test equipment clock signal is coupled from test equipment to the integrated circuit at a step 1008. A programmable logic device is configured with a circuit to be tested at a step 1010. The clock synthesis value is applied to the programmable logic device at a step 1012. An internal test clock signal is generated based upon the clock synthesis value and the test equipment clock signal at a step 1014. The integrated circuit is tested using the internal test clock signal at a step 1016. A clock is switched between the internal test clock signal and the test equipment clock signal to generate test data and provide idle time to strobe the data at a step 1018. Output signals generated by the integrated circuit are verified by the test equipment at a step 1020. It is then determined whether an error is detected in any of the circuit elements of the device under test at a step 1022. An offset is provided by adding external test clock cycles at the start of a test to position the pulse of the internal test clock signal having an error at the time when the data is strobed during an idle period at a step 1024. Finally, diagnosis and failure analysis is provided during the idle period at a step 1026.

It can therefore be appreciated that the new and novel method of and system for testing an integrated circuit has been described. It will be appreciated by those skilled in the art that numerous alternatives and equivalents will be seen to exist which incorporate the disclosed invention. As a result, the invention is not to be limited by the foregoing embodiments, but only by the following claims.

I claim:

1. A method of testing an integrated circuit, said method comprising the steps of:
   coupling test equipment to said integrated circuit;
   coupling a test equipment clock signal from said test equipment to said integrated circuit, said test equipment clock signal having a first frequency;
   generating an internal burst clock signal within said integrated circuit based upon said test equipment clock signal, said internal burst clock signal having a burst frequency;
   selecting said test equipment clock signal or said internal burst clock signal as an internal test clock signal in response to a switch signal, said switch signal being generated responsive to a count of pulses of said internal test clock signal;
   testing said integrated circuit using said internal test clock signal in a first test cycle;
   identifying an error at a predetermined pulse of said internal test clock signal applied during said first test cycle; and
   testing said integrated circuit in a second test cycle, wherein data associated with said predetermined pulse of said internal test clock signal during said second test cycle is captured by a data strobe associated with said test equipment clock signal for generating output data.

2. The method of claim 1 further comprising a step of selecting said first frequency for said test equipment clock signal for operating said test equipment.

3. The method of claim 1 further comprising a step of selecting a multiplier value for generating said internal burst clock signal based upon said test equipment clock signal.

4. The method of claim 1 further comprising a step of verifying output signals generated by said integrated circuit.

5. The method of claim 1 further comprising a step of verifying multiple input signature register signals generated by said integrated circuit.

6. The method of claim 5 further comprising a step of maintaining said burst frequency of said internal burst clock signal below a maximum frequency for a multiple input signature register.

7. The method of claim 1 further comprising a step of coupling an output from said integrated circuit to said test equipment at the said first frequency.

8. A method of testing an integrated circuit coupled to test equipment, said method comprising the steps of:
   configuring said integrated circuit;
   applying a clock synthesis value to said integrated circuit;
   generating an internal burst clock signal based upon said clock synthesis value and a test equipment clock signal from said test equipment;
   selecting said test equipment clock signal or said internal burst clock signal as an internal test clock signal in response to a switch signal, said switch signal being generated responsive to a count of pulses of said internal test clock signal;
   generating test data using said internal test clock signal in a first test cycle;
   identifying an error at a predetermined pulse of said internal test clock signal applied during said first test cycle; and
   testing said integrated circuit in a second test cycle, wherein data associated with said predetermined pulse of said internal test clock signal during said second test cycle is captured by a data strobe associated with said test equipment clock signal for generating output data.

9. The method of claim 8 wherein said step of generating an internal burst clock signal comprises a step of locking to a frequency based upon said test equipment clock signal using a frequency synthesizer.

10. The method of claim 9 wherein said step of applying a clock synthesis value to said integrated circuit comprises a step of applying multiplier value to said frequency synthesizer to generate said internal burst clock signal.

11. The method of claim 8 wherein said step of testing said integrated circuit in a second test cycle comprises a step of shifting said predetermined pulse of said internal test clock signal to a time to enable data associated with said predetermined pulse to be strobed.

12. The method of claim 11 wherein said step of shifting said predetermined pulse of said internal test clock signal comprises a step of providing an offset by adding external test clock cycles at the start of said internal test clock signal.

13. The method of claim 8 further comprising a step of verifying an output signal of said integrated circuit to generate a test output.

14. A system for testing the operation of a circuit, said system comprising:
   an integrated circuit implementing said circuit;
   test equipment coupled to said integrated circuit, said test equipment operating at a first frequency and programming said integrated circuit to operate at a second frequency;
   a control circuit generating an internal clock signal switching between a first clock signal having said first frequency and a second clock signal having said second frequency, said control circuit performing said switching responsive to a count of pulses of said internal clock signal and identifying an error at a predetermined pulse of said internal clock signal applied during a first test cycle; and
   test data output by said integrated circuit to said test equipment, wherein said test data is associated with said predetermined pulse of said internal clock signal applied during a second test cycle and is captured by a data strobe associated with said first clock signal of said test equipment for generating said test data to verify the operation of said circuit.

15. The system of claim 14 wherein said integrated circuit comprises a frequency synthesizer for generating at least one of the said first and second clock signals.

16. The system of claim 15 wherein said frequency synthesizer is implemented in a programmable logic device.

17. The system of claim 14 wherein said second clock signal is a burst clock signal having a burst clock frequency.

18. The system of claim 14 wherein said test equipment generates an output verifying the operation of said circuit.

19. The system of claim 18 wherein said output comprises an output based upon a multiple input signature register value.

* * * * *

UNITED STATES PATENT AND TRADEMARK OFFICE
CERTIFICATE OF CORRECTION

PATENT NO.        : 7,620,862 B1                                   Page 1 of 1
APPLICATION NO. : 11/221438
DATED             : November 17, 2009
INVENTOR(S)       : Andrew Wing-Leung Lai It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 749 days.

Signed and Sealed this

Twenty-sixth Day of October, 2010

David J. Kappos
*Director of the United States Patent and Trademark Office*